(12) United States Patent
Kumar et al.

(10) Patent No.: US 11,070,234 B2
(45) Date of Patent: *Jul. 20, 2021

(54) MEMORY SYSTEM WITH HYBRID DECODING SCHEME WITH INFORMATION EXCHANGE AND METHOD OF OPERATING SUCH MEMORY SYSTEM

(71) Applicant: SK hynix Inc., Gyeonggi-do (KR)

(72) Inventors: Naveen Kumar, San Jose, CA (US); Aman Bhatia, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/355,325

(22) Filed: Mar. 15, 2019

(65) Prior Publication Data

US 2019/0288707 A1 Sep. 19, 2019

Related U.S. Application Data

(60) Provisional application No. 62/643,989, filed on Mar. 16, 2018.

(51) Int. Cl.
*H03M 13/00* (2006.01)
*H03M 13/11* (2006.01)
*G06F 3/06* (2006.01)

(52) U.S. Cl.
CPC ......... *H03M 13/112* (2013.01); *G06F 3/0614* (2013.01); *G06F 3/0658* (2013.01); *G06F 3/0673* (2013.01); *H03M 13/1108* (2013.01)

(58) Field of Classification Search
CPC ........... H03M 13/112; H03M 13/1108; H03M 13/3715; H03M 13/6577; H03M 13/1111; G06F 3/0673; G06F 3/0614; G06F 3/0658; G06F 11/1068; G11C 29/42
USPC ......................... 714/752, 755, 764, 800–805
See application file for complete search history.

(56) References Cited

U.S. PATENT DOCUMENTS

| | | | |
|---|---|---|---|
| 7,035,285 | B2 | 4/2006 | Holloway et al. |
| 7,502,982 | B2 | 3/2009 | Silvus et al. |
| 8,069,397 | B2 | 11/2011 | Vityaev et al. |

(Continued)

OTHER PUBLICATIONS

Jinghu Chen and Marc Fossorier, Near optimum universal belief propagation based decoding of low-density parity check codes, IEEE Transactions on Communications, vol. 50, No. 3, Mar. 2002.

*Primary Examiner* — Albert Decady
*Assistant Examiner* — Osman M Alshack
(74) *Attorney, Agent, or Firm* — IP & T Group LLP

(57) ABSTRACT

Memory controllers, decoders and methods execute a hybrid decoding scheme with exchange of information between multiple decoders. A first type of decoder performs initial decoding of a codeword when an unsatisfied check (USC) count of the codeword is less than a threshold, and a second type of decoder performs decoding of a codeword when the USC count of the codeword is greater than or equal to the threshold. During decoding by one of the decoders, the controller generates information from an output of that decoder and send the information to the other decoder, which the other decoders uses in decoding. The codeword is routed and rerouted between the decoders, which may include a q-bit bit-flipping (q-BF) decoder and a min-sum (MS) decoder, based on conditions that occur during decoding.

12 Claims, 6 Drawing Sheets

(56) References Cited

U.S. PATENT DOCUMENTS

| | | | |
|---|---|---|---|
| 8,621,318 B1* | 12/2013 | Micheloni | H03M 13/3707 |
| | | | 714/755 |
| 9,092,353 B1* | 7/2015 | Micheloni | G06F 11/1068 |
| 9,565,581 B2 | 2/2017 | Zhang et al. | |
| 9,614,548 B1 | 4/2017 | Nguyen et al. | |
| 9,842,020 B2 | 12/2017 | Sengoku | |
| 10,164,656 B2* | 12/2018 | Yang | H03M 13/45 |
| 2004/0134988 A1 | 7/2004 | Pettinelli, Jr. et al. | |
| 2005/0041746 A1 | 2/2005 | Rosen et al. | |
| 2009/0282319 A1* | 11/2009 | No | H03M 13/2906 |
| | | | 714/780 |
| 2013/0046958 A1* | 2/2013 | Zhang | H03M 13/1111 |
| | | | 712/208 |
| 2014/0223256 A1* | 8/2014 | Sakai | G06F 11/1012 |
| | | | 714/758 |
| 2014/0313610 A1* | 10/2014 | Zhang | G11B 20/10268 |
| | | | 360/53 |
| 2015/0263761 A1 | 9/2015 | Varnica et al. | |
| 2016/0274971 A1* | 9/2016 | Kang | G06F 11/1012 |
| 2017/0125114 A1 | 5/2017 | Alhussien et al. | |
| 2017/0168894 A1* | 6/2017 | Kim | G11C 29/52 |
| 2017/0310342 A1 | 10/2017 | Yen et al. | |
| 2018/0013450 A1* | 1/2018 | Hsiao | H03M 13/353 |
| 2018/0293131 A1* | 10/2018 | Lin | G11C 29/52 |
| 2019/0149168 A1* | 5/2019 | Chang | H03M 13/1108 |
| | | | 714/752 |

* cited by examiner

MEMORY SYSTEM WITH HYBRID DECODING SCHEME WITH INFORMATION EXCHANGE AND METHOD OF OPERATING SUCH MEMORY SYSTEM

CROSS-REFERENCE TO RELATED APPLICATION

This application claims the benefit of U.S. Provisional Application No. 62/643,989, filed on Mar. 16, 2018, the entire content of which is incorporated herein by reference.

BACKGROUND

1. Field

Embodiments of the present disclosure relate to a memory system and components thereof capable of executing a hybrid decoding scheme that includes passing information between multiple decoders, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller may include an embedded processor that executes functional components such as firmware. The SSD functional components are typically device specific, and in most cases, can be updated.

The two main types of flash memories are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives (SSDs), and similar products, for general storage and transfer of data.

A flash memory, e.g., of the NAND-type, may apply any of various error correction codes to correct errors in data. One such error correction code is low-density parity-check code (LDPC), which is an advanced error code that is used to recover a relatively large number of errors in data.

A bit-flipping (BF) decoder can be used for decoding LDPC codewords. The BF decoder provides higher throughput and consumes relatively low power on system-on-chip (SoC) architecture. However, the correction capability of a BF decoder is limited, and its performance has an error floor. Relative to the BF decoder, a min-sum (MS) decoder has much higher correction capability and may be used for codewords that a BF decoder failed to decode. However, the MS decoder has lower throughput and requires higher power on SoC.

Also, a BF decoder is useful at the beginning of the life of a NAND flash storage when errors from the NAND are much lower compared to the middle to end of the life and the end of the life of the NAND.

In this context embodiments of the present invention arise.

SUMMARY

Aspects of the present invention include memory controllers and decoders. In one aspect, a memory controller comprises a first decoder configured to perform decoding of a codeword when an unsatisfied check (USC) count of the codeword is less than a threshold; and a second decoder configured to perform decoding of a codeword when the USC count of the codeword is greater than or equal to the threshold. The controller is configured to generate first information from an output of the first decoder and send the first information to the second decoder, and is configured to generate second information from an output of the second decoder and send the second information to the first decoder.

In this aspect, the first decoder is preferably a q-bit bit-flipping (q-BF) decoder and the second decoder is preferably a min-sum (MS) decoder.

In another aspect a memory controller comprises a decoder assembly including a q-bit bit-flipping (q-BF) decoder and a min-sum (MS) decoder. The decoder assembly is configured to determine whether or not the codeword is within the error correction capability of the q-BF decoder, generate first information during decoding by the q-BF decoder and send the first information to the MS decoder, and generate second information during decoding by the MS decoder and send the second information to the q-BF decoder.

Further aspects of the present invention include methods of decoding, which may be performed by memory controllers and components thereof, such as multiple decoders. In this regard, another aspect of the present invention, entails a method of decoding a codeword, which comprises determining, based on characteristics of the codeword, which of multiple decoders, including a first decoder and a second decoder, is more suitable for initial decoding; performing one or more iterations of decoding on the codeword using the first decoder based on the result of the determining operation; determining, during decoding using the first decoder, whether a condition is satisfied; generating information from the output of the first decoder and processing the information for use by the second decoder; transmitting the information to the second decoder; routing the codeword to the second decoder when it is determined that the condition is satisfied; and performing one or more iterations of decoding on the codeword using the second decoder and the information.

In this aspect, one of the first and second decoders is preferably a q-bit bit-flipping (q-BF) decoder and the other is a min-sum (MS) decoder.

Additional aspects of the present invention will become apparent from the following description.

DETAILED DESCRIPTION

Figure 1:
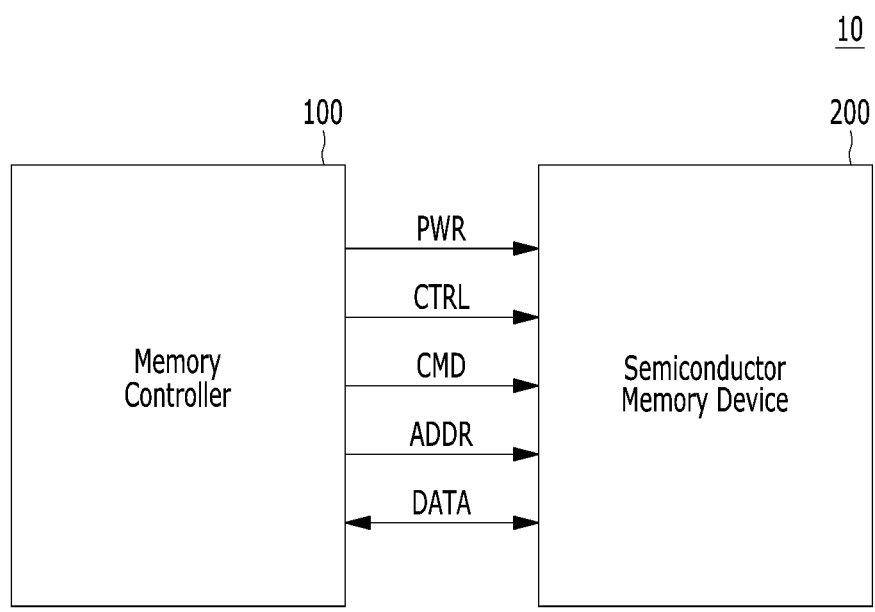
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAN D-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
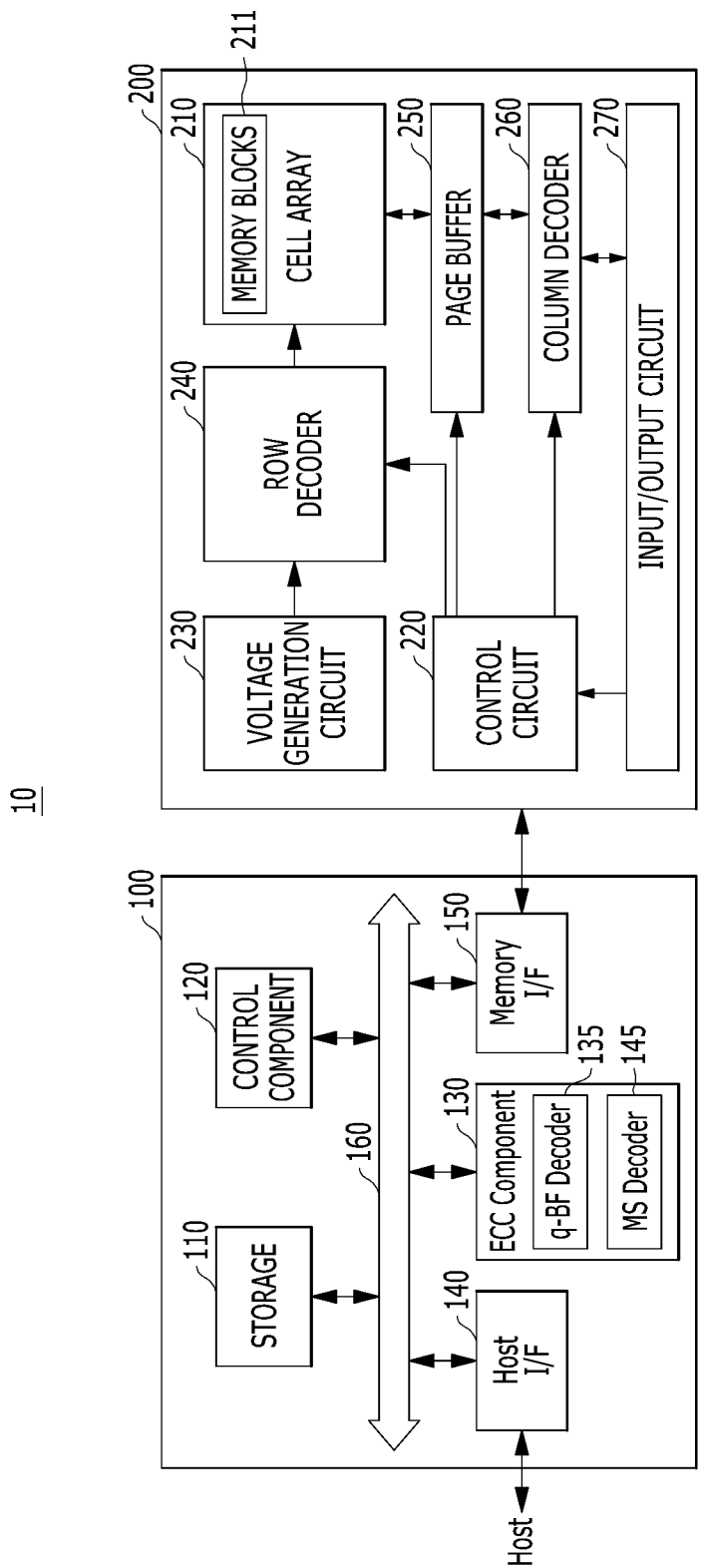
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a block coded modulation (BCM), or Generalized LDPC (GLDPC) code, the latter of which has particular relevance to the present invention. The ECC component 130 may include any and all circuits, systems or devices for suitable error correction operation in accordance with embodiments of the present invention.

The present invention is particularly applicable to decoding LDPC codes using a bit-flipping (BF) decoder for which q bits of information is stored for each bit in the BF decoder, which is referred to a q-BF decoder, and a min-sum (MS) decoder. To that end, in embodiments of the present invention, the ECC component 130 includes a q-BF decoder 135 and an MS decoder 145. As explained in more detail below, the ECC component 130 including the q-BF and MS decoders 135, 145 are configured to execute a hybrid decoding scheme on LDPC codes with the exchange of information.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component or CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer (array) 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
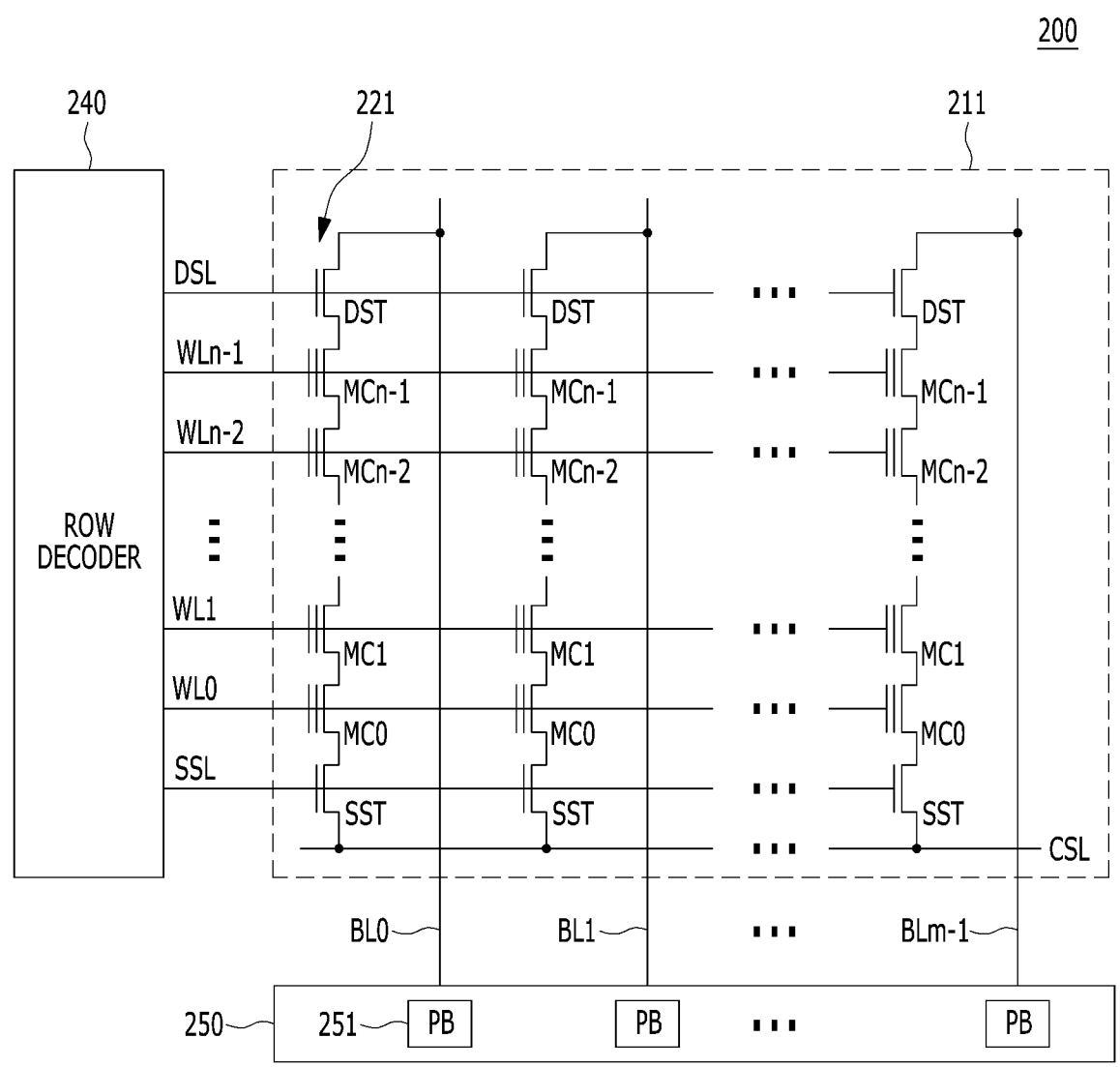
FIG. 3 is a circuit diagram illustrating a memory block of a memory device of a memory system in accordance with an embodiment of the present invention.

The page buffer (array) 250 may be in electrical communication with the memory cell array 210 through bit lines BL (shown in FIG. 3). The page buffer (array) 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer (array) 250, and may also exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

As previously noted, the page buffer 250 may be in the form of a page buffer array including a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
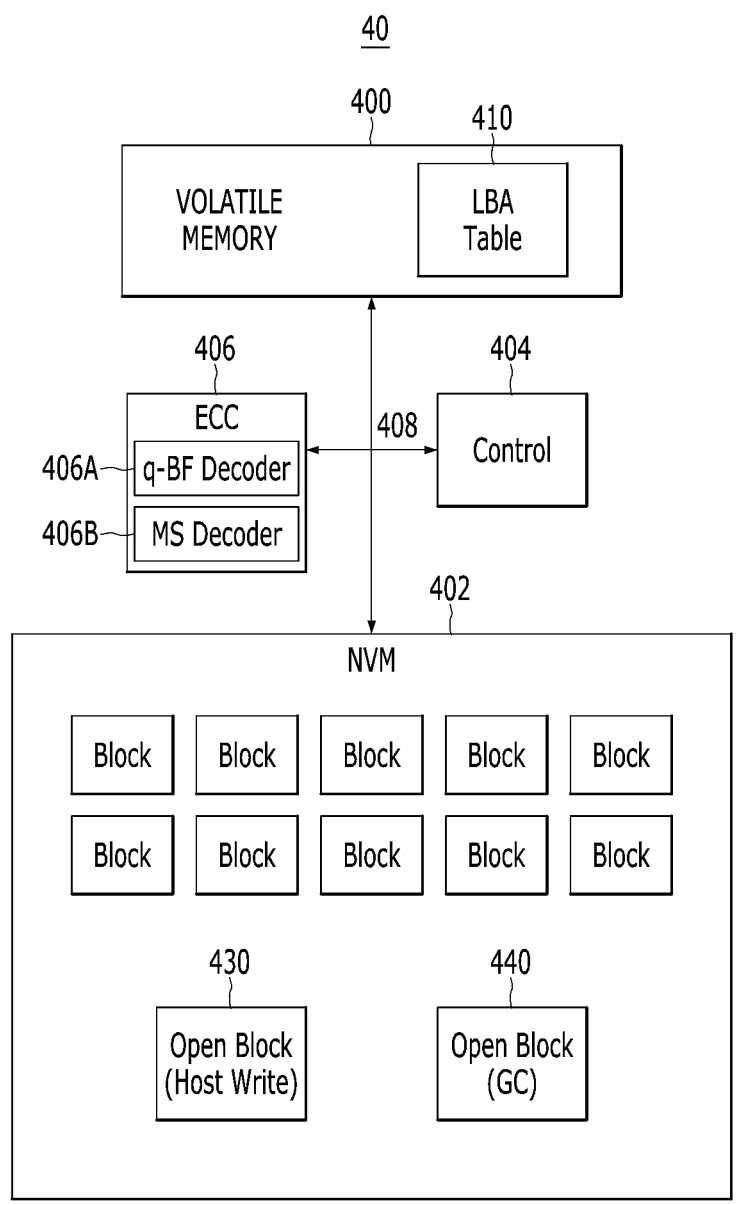
FIG. 4 is a schematic diagram of a memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address (LBA) table 410 for mapping physical-to-logical addresses of bits. The NVM 402 may include a plurality of memory blocks, as well as an open block for host writes 430 and an open block for garbage collection (GC) 440. Multiple memory blocks may be grouped together as a super block for certain functional purposes.

The ECC module 406 may include a q-BF decoder 406A and an MS decoder 406B, which may correspond to the q-BF decoder 135 and the MS decoder 145 respectively in FIG. 2. The ECC module 406 including its q-BF and MS decoders 406A, 406B may be used to carry out aspects of the present invention. Additional/alternative components that may be utilized with memory systems to effectuate the present invention will be understood to those of skill in the art in light of this disclosure.

BF decoders provide higher throughput and lower power on SoC architecture relative to MS decoders, but MS decoders have higher error correction capability. To further improve the use of BF and MS decoders, taking into account the trade-offs, the inventors have devised a framework to pass or exchange information between BF and MS decoders. The framework generally involves generating soft information from a BF decoder and generating q bits of quantized information from MS soft decoding information. In accordance with embodiments of the present invention, an inventive scheme is provided to propagate information across or between BF and MS decoders. Such scheme provides substantial power and throughput gains.

In embodiments of the present invention, a q-bit BF decoder, e.g., q-bit BF decoder 135, is employed. This means that q bits of information is stored for each bit in the q-BF decoder 135. Preferably, the q-BF decoder 135 uses 2 bits of information at or for each bit in the codeword. While more bits of information, e.g., higher values of q, may be used, such higher values require larger area and power on SoC, which at a certain upper level tends to defeat the purpose of using a BF decoder.

As noted above, BF decoder correction capability is much lower than that of an MS decoder. With this in mind, the inventors devised a scheme for passing soft information obtained from the output of the q-bit BF decoder 135 to an MS decoder, e.g, MS decoder 145, for bits that are flipped with high confidence. Also, soft information may be passed from the MS decoder 145 to the q-BF decoder 135, but such information should be quantized to q bits. A quantizer may be employed to maximize the mutual information from the quantized value to the output of the MS decoder 145. Similarly, a mapping scheme maps a q-bit output from the BF decoder 135 to log-likelihood ratio (LLR) for the MS decoder 145. This decoding can be done iteratively until the data is decoded successfully.

Thus, embodiments of the present invention make intelligent use of the q-BF decoder 135 and the MS decoder 145 in terms of scheduling which decoder should be used at a particular time, as well as exchanging information to further assist the receiving decoder in decoding the codeword. Such framework and scheme advantageously increases throughput and lowers power consumption of a decoding architecture implemented on SoC architecture. By receiving information from the MS decoder 145, the q-BF decoder 135 becomes more robust, and as a result the framework and scheme, are designed to maximize usage of the q-BF decoder 135 particularly as it exploits information received from the MS decoder 145.

Figure 5:
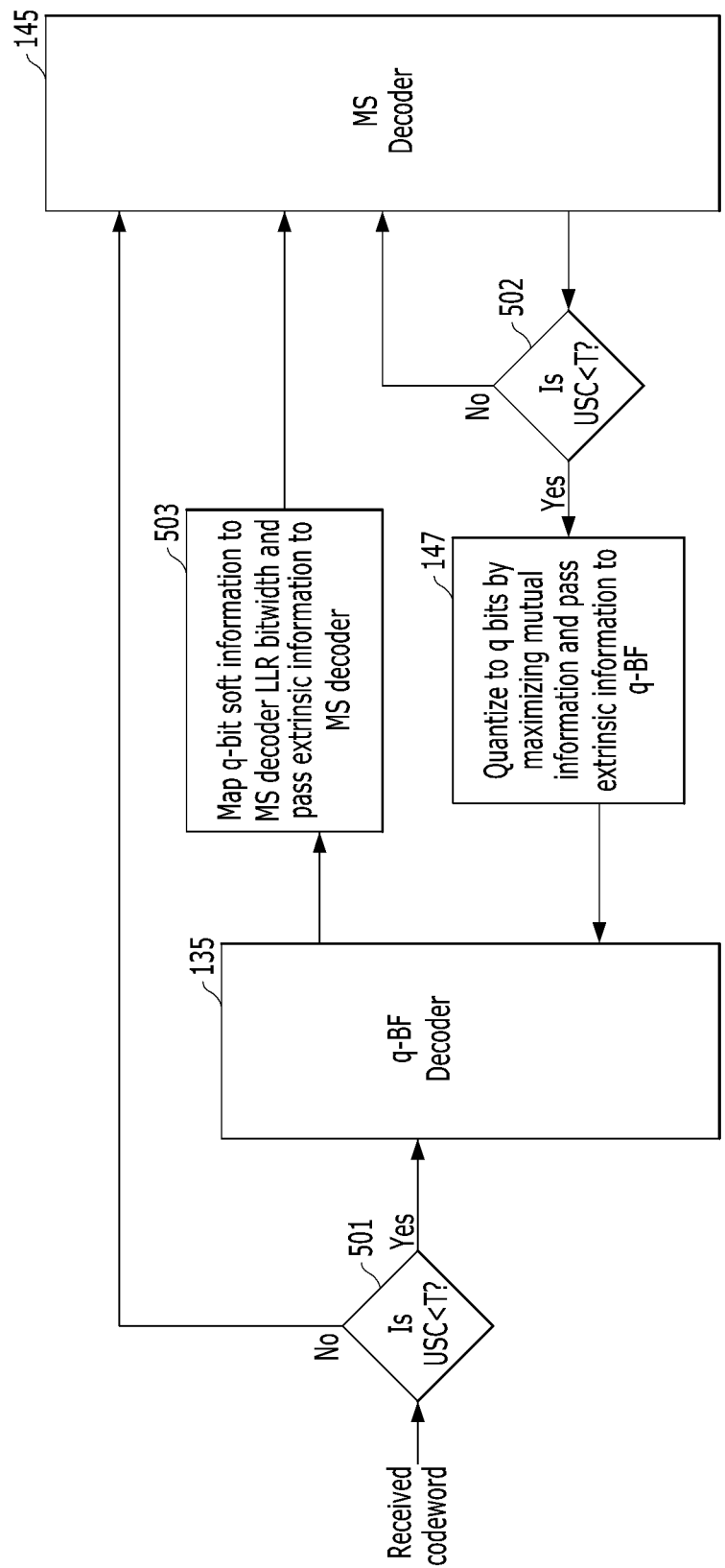
FIG. 5 is a schematic diagram showing structure and flow of hybrid LDPC decoding executed by exchanging information between multiple decoders, in accordance with an embodiment of the present invention.

FIG. 5 shows structure and flow for hybrid decoding of LDPC codewords by passing information between q-BF and MS decoders in accordance with embodiments of the present invention. The decoding may be performed by the q-BF decoder 135/406A and MS decoder 145/406B within the ECC component 130 or ECC module 406 respectively, and may operate in conjunction with other components of the memory controller 100. The q-BF decoder 135/406A and MS decoder 145/406B may be implemented with appropriate hardware, software, firmware or combination thereof.

A codeword is obtained from reading the memory device 200, e.g., NAND flash memory. At decision block 501, unsatisfied check (USC) information on the codeword is calculated, e.g., the USC count of the codeword is calculated, to determine whether initial decoding of the codeword is to be performed by the q-BF decoder 135 or the MS decoder 145, and the USC count is compared with a threshold T, which can be optimized heuristically. It is noted that each of the q-BF decoder 135 and the MS decoder 145 has an optimal setting for a bit error rate (BER) that provides maximum correction capability. The settings of the decoders 135, 145 can be optimized offline such that they are known at the time of decoding. Thus, more generally, the decision at block 501 ascertains whether or not the codeword is within error correction capability of the q-BF decoder 135.

If the determination at 501 indicates that the USC count is too high, i.e., greater than or equal to the threshold T (No at 501), then decoding begins with the MS decoder 145. Such decoding with the MS decoder 145 continues until the number of errors in the codeword is within the correction capability of the q-BF decoder 135. Thus, the USC count check is again made at decision block 502 during MS decoding. The check may be made after each iteration of MS decoding or at other suitable interval. The check may include predicting BER using the obtained USC information. As long as the USC count remains greater than or equal to the threshold T (No at 502), decoding continues with the MS decoder 145.

When the USC count becomes less than the threshold T, as determined at decision block 502, quantized soft information is generated from the output of the MS decoder 145 and passed to the q-BF decoder 135. Soft information from the output of the MS decoder 145 is quantized using, e.g., a quantizer 147, which may be a component of the memory controller 100. The quantization preferably is performed in such a way that maximizes the mutual information between the output of the MS decoder 145 and the output of the quantizer 147. A log-likelihood ratio (LLR) mapping table is devised to generate quantized information. Extrinsic information is then calculated by subtracting extrinsic information of the q-BF decoder 135 from the quantized output.

The extrinsic information calculated by the quantizer 147 is then passed to the q-BF decoder 135, where additional decoding of the codeword is performed. Decoding continues with the q-BF decoder 135 until the codeword is successfully decoded or it is determined that such decoding is not converging or is otherwise not likely to succeed. In the latter case, the codeword is routed back to the MS decoder 145 for further decoding.

Returning to decision block 501, if such decision indicates that the USC count is low enough, i.e., less than the threshold T (Yes at 501), then decoding begins with the q-BF decoder 135. Decoding continues with the q-BF decoder 135 until the codeword is successfully decoded or it is determined that such decoding is not converging or is otherwise not likely to succeed. In the latter case, the codeword is routed to the MS decoder 145 for further decoding.

Thus, whether codeword is routed to the MS decoder 145 for the first time or is routed back to the MS decoder 145, following decoding with the q-BF decoder 135, soft information is generated from the output of the q-BF decoder 135, as represented by block 503. In doing so, another mapping table, e.g., an LLR mapping table, is formulated heuristically which maps q bits of the output of the q-BF decoder 135 to the required bit-width information of the MS decoder 145. A method to generate an LLR mapping table for an LDPC decoder from hard read information obtained from a NAND flash memory may be used. Such method maps LLRs to higher precision. It is noted here that extrinsic information is fed into the feedback at each iteration of decoding.

Another inventive aspect of the present invention is that the mapping tables for passing information across and between the q-BF decoder 135 and the MS decoder 145 take into account the fact that the correction capability of the MS decoder 145 is much better than that of the q-BF decoder 135. The extrinsic information passed from the q-BF decoder 135 to the MS decoder 145 is first scaled down, and the extrinsic information from the MS decoder 145 is scaled up before passing it to the q-BF decoder 135. These mapping tables are generated heuristically based on the LDPC codes and the BER regime on which the decoding architecture is working. A linear predictor on USC information at all iterations of the MS decoder 145 can predict BER accurately and an appropriate mapping may be selected based on this BER information. The decoding is performed iteratively until the data is decoded successfully.

Figure 6:
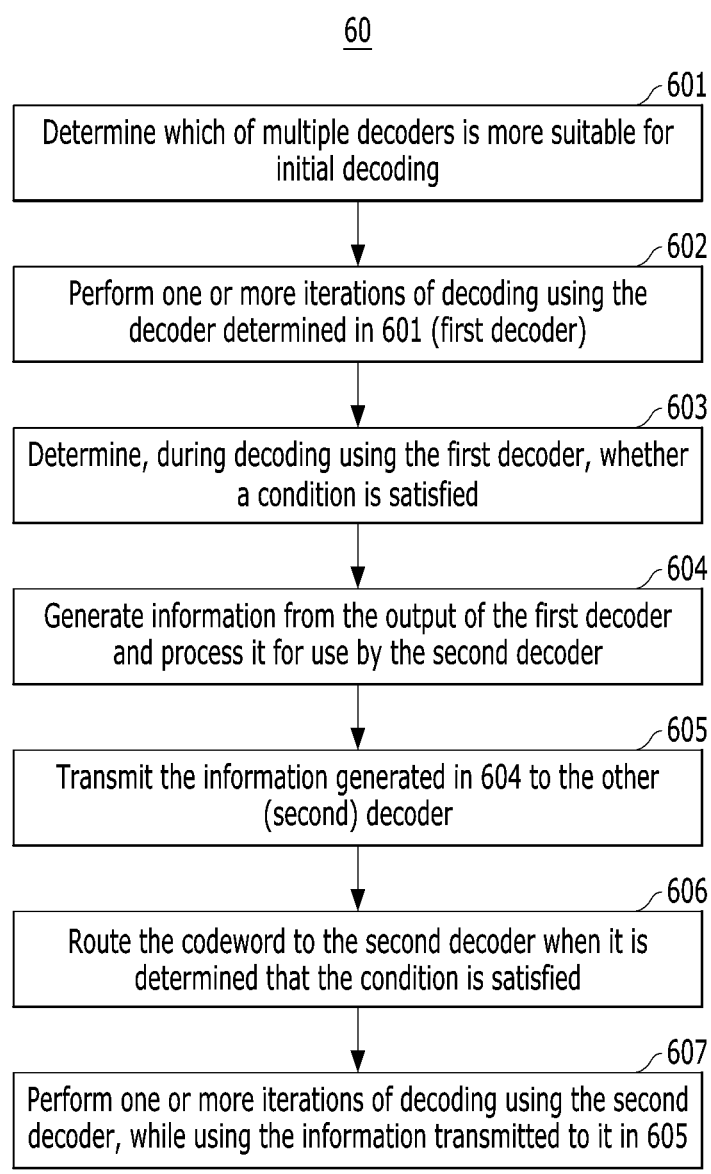
FIG. 6 is a flow chart illustrating steps in processes for hybrid decoding with the exchange of information between multiple decoders, in accordance with embodiments of the present invention.

FIG. 6 is a flow chart describing steps in processes for hybrid decoding with information exchange between multiple decoders, in accordance with embodiments of the present invention. The steps shown in flow chart 60 are exemplary. Those skilled in the art will understand that additional and/or alternative steps may be performed, or that the order of steps may be changed, to effectuate aspects of the present invention without departing from the inventive concepts disclosed herein.

A codeword for decoding is received from the memory device 200, e.g., NAND flash memory, for decoding. At step 601, a determination is made as to which of multiple decoders, including the q-BF decoder 135 and the MS decoder 145, is more suitable for initial decoding. In an embodiment, the USC count of the codeword is calculated and compared with a threshold T to make this determination, as explained with reference to FIG. 5. Next, at step 602, one or more iterations of decoding are performed on the codeword using the decoder, which may be either the q-BF decoder 135 or the MS decoder 145, determined to be more suitable (first decoder). During such decoding, for example after each iteration, it is determined at step 603 whether a condition is satisfied. In the case that the first decoder is the q-BF decoder 135, the condition may be a metric that measures whether or not decoding is converging or otherwise succeeding. In the case that the first decoder is the MS decoder 145, the condition may be a metric that measures whether the errors in the codeword have been reduced to a level where decoding is within the error correction capability of the q-BF decoder 135.

During decoding with the first decoder, information is generated from its output and processed for use by the second decoder at step 604. Such information may be that generated and processed as explained in connection with block 503 of FIG. 5 when the first decoder is the q-BF decoder 135, whereas such information may be that generated and processed by the quantizer 147 when the first decoder is the MS decoder 145. Next, at step 605, the generated information is transmitted or passed to the other (second) decoder. That is, when the first decoder is the q-BF decoder 135, the generated information is transmitted to the MS decoder 145, and when the first decoder is the MS decoder 145, the generated information is transmitted to the q-BF decoder 135. Such information may be transmitted before, after transmission of the codeword, or with transmission of the codeword when it is determined that the condition imposed relative to the first decoder is satisfied.

Thus, the flow includes an operation of routing the codeword to the second decoder for continued decoding when the condition is satisfied, which is represented by step 606. Once the codeword is so routed, the second decoder performs one or more iterations of decoding on the codeword at step 607.

Thus, the codeword may be effectively routed and rerouted between the q-BF decoder 135 and the MS decoder 135 to improve the decoding process. To further improve the process, useful information from one decoder is transmitted to the other decoder to assist the latter in decoding.

Thus, embodiments of the present invention provide an effective hybrid decoding scheme which utilizes two different types of decoders that exchange information, to execute decoding to improve throughput and consume less power. Decoding is switched between two types of decoding, e.g., BF decoding and MS decoding, and each takes advantage of information from the other decoder to improve decoding and lower power consumption.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory controller, comprising:
a first decoder configured to perform decoding of a codeword when an unsatisfied check (USC) count of the codeword is less than a threshold;
a second decoder configured to perform decoding of a codeword when the USC count of the codeword is greater than or equal to the threshold, the decoding performed by the second decoder to continue until the USC count of the codeword is less than the threshold, indicating that the codeword is within the error correction capability of the first decoder, at which time continued decoding of the codeword is performed by the first decoder until the codeword is successfully decoded or it is determined that decoding with the first decoder is not likely to succeed,
wherein the memory controller is configured to generate first information from an output of the first decoder and send the first information to the second decoder,
wherein the memory controller is configured to generate second information from an output of the second decoder, and
send the second information to the first decoder only when it is determined that the USC count of the codeword is less than the threshold,
wherein the memory controller further comprises a quantizer that generates the second information by quantizing soft information output by a MS decoder to q bits,
wherein the first decoder is a q-bit bit-flipping (q-BF) decoder and the second decoder is a min-sum (MS) decoder, and
wherein the quantizer performs the quantizing to maximize mutual information between the output of the MS decoder and the output of the quantizer.

2. The memory controller of claim 1, wherein the memory controller generates the first information by mapping q-bit soft information to a bit-width of the MS decoder.

3. The memory controller of claim 2, wherein the memory controller generates a mapping table to reflect the mapping of the q-bit soft information to the bit-width of the MS decoder.

4. The memory controller of claim 1, wherein the codeword comprises low-density parity-check (LDPC) codes.

5. A memory controller comprising:
a decoder assembly including a q-bit bit-flipping (q-BF) decoder and a min-sum (MS) decoder, the decoder assembly configured to:
determine, one or more times during decoding of a codeword by the MS decoder, whether or not the codeword is within the error correction capability of the q-BF decoder,
send the codeword to the q-BF decoder when it is determined that the codeword is within the error correction capability of the q-BF decoder, the decoding with the q-BF decoder continuing until the codeword is successfully decoded or it is determined that decoding with the q-BF decoder is not likely to succeed;
generate first information during decoding of the codeword by the q-BF decoder and send the first information to the MS decoder,
generate second information during decoding of the codeword by the MS decoder, and
send the second information to the q-BF decoder only when it is determined that the codeword is within the error correction capability of the q-BF decoder,
wherein the memory controller further comprises a quantizer that generates the second information by quantizing soft information output by a MS decoder to q bits, and
wherein the quantizer performs the quantizing to maximize mutual information between the output of the MS decoder and the output of the quantizer.

6. The memory controller of claim 5, wherein:
the q-BF decoder is configured to perform one or more iterations of decoding on the codeword, when it is determined that the codeword is within the error correction capability of the q-BF decoder, the one or more iterations of decoding on the codeword using the q-BF decoder continuing until the codeword is successfully decoded or it is determined that the decoding of the codeword is not converging, and the MS decoder is configured to perform one or more iterations of decoding on the codeword, when it is determined that the codeword is not within the error correction capability of the q-BF decoder, the one or more iterations of decoding on the codeword using the MS decoder continuing until it is determined that the codeword is within the error correction capability of the q-BF decoder.

7. The memory controller of claim 5, wherein the decoder assembly generates the first information by mapping q-bit soft information to a bit-width of the MS decoder.

8. A method of decoding a codeword, the method comprising:
   determining, based on characteristics of the codeword, which of multiple decoders, including a q-bit bit-flipping (BF) decoder and a min-sum (MS) decoder, is more suitable for initial decoding;
   performing one or more iterations of decoding on the codeword using the BF decoder or the MS decoder based on the result of the determining operation;
   determining, during decoding using the MS decoder, when the MS decoder is selected based on the result of the determining operation, when the codeword is within the error correction capability of the BF decoder, at which time continued decoding of the codeword is performed by the BF decoder until the codeword is successfully decoded or it is determined that decoding with the BF decoder is not likely to succeed;
   generating and processing MS decoder information for use by the BF decoder after at least one iteration of decoding on the codeword is performed by the MS decoder and it is determined that the codeword is within the correction capability of the BF decoder;
   routing the codeword and the MS decoder information to the BF decoder when it is determined that the codeword is within the error correction capability of the BF decoder;
   performing one or more iterations of decoding on the codeword using the BF decoder and the MS decoder information and generating BF decoder information pertaining to results of the decoding by the BF decoder; and
   determining, during decoding using the BF decoder, whether or not decoding is to continue with the BF decoder or further decoding is to be performed by the MS decoder based on whether or not decoding is converging using the BF decoder,
   wherein the generating of MS decoder information from the output of the MS decoder comprises:
   quantizing soft information to q bits using a quantizer, and
   wherein the quantizer performs the quantizing to maximize mutual information between the output of the MS decoder and the output of the quantizer.

9. The method of claim 8, wherein the generating of BF decoder information from the output of the BF decoder comprises:
   mapping q-bit soft information to a bit-width of the MS decoder.

10. The method of claim 9, wherein the mapping comprises generating a mapping table to map the q-bit soft information to the bit-width of the MS decoder.

11. The method of claim 10, wherein the bit-width of the MS decoder is the log-likelihood ratio (LLR) bit-width of the MS decoder.

12. The method of claim 8, wherein the codeword comprises low-density parity-check (LDPC) codes.

* * * * *